United States Patent
Santos et al.

(10) Patent No.: US 8,514,119 B2
(45) Date of Patent: Aug. 20, 2013

(54) HIGH-SPEED VOLTAGE-LEVEL CONVERTER USING CAPACITOR

(75) Inventors: Bruno M. S. Santos, Alverca do Ribatejo (PT); Antonio I. R. Leal, Sintra (PT); Carlos M. A. Azeredo-Leme, Lisbon (PT)

(73) Assignee: Synopsys, Inc., Mountain View, CA (US)

(*) Notice: Subject to any disclaimer, the term of this patent is extended or adjusted under 35 U.S.C. 154(b) by 77 days.

(21) Appl. No.: 13/183,372

(22) Filed: Jul. 14, 2011

(65) Prior Publication Data

US 2013/0015994 A1    Jan. 17, 2013

(51) Int. Cl.
*H03M 1/66*    (2006.01)
(52) U.S. Cl.
USPC .............. 341/144; 327/333; 326/63; 323/234
(58) Field of Classification Search
USPC ........... 341/144; 327/333; 323/234; 326/63
See application file for complete search history.

(56) References Cited

U.S. PATENT DOCUMENTS

| | | | | |
|---|---|---|---|---|
| 4,486,670 A | * | 12/1984 | Chan et al. | 326/81 |
| 5,625,360 A | * | 4/1997 | Garrity et al. | 341/144 |
| 5,742,183 A | * | 4/1998 | Kuroda | 326/81 |
| 6,677,798 B2 | * | 1/2004 | Chang et al. | 327/333 |
| 7,777,549 B2 | * | 8/2010 | Harada | 327/333 |
| 7,915,921 B1 | * | 3/2011 | Roo et al. | 326/81 |
| 2006/0071895 A1 | * | 4/2006 | Miyazawa et al. | 345/92 |
| 2007/0024479 A1 | * | 2/2007 | Lin et al. | 341/144 |
| 2007/0182616 A1 | * | 8/2007 | Quinn et al. | 341/154 |
| 2008/0088353 A1 | * | 4/2008 | Kuo | 327/333 |
| 2009/0231014 A1 | * | 9/2009 | Harada | 327/333 |
| 2011/0031944 A1 | * | 2/2011 | Stirk et al. | 323/234 |

* cited by examiner

*Primary Examiner* — Linh Nguyen
(74) *Attorney, Agent, or Firm* — Fenwick & West LLP

(57) ABSTRACT

A voltage-level convertor including a switch and a capacitor which receives an input signal of a first voltage range and generates a level-converted signal of a second voltage range. The switch operates in a low voltage level, and hence, the switch can be implemented as a thin oxide device that responds quickly to the input signal. The capacitor is coupled between the switch and an output node. The capacitor is charged to a predetermined voltage. In response to receiving the output from the switch, an output signal with a converted voltage level is generated from the conductor of the capacitor connected to the output node.

20 Claims, 4 Drawing Sheets

HIGH-SPEED VOLTAGE-LEVEL CONVERTER USING CAPACITOR

BACKGROUND

1. Field of the Disclosure

The disclosure relates to a voltage-level converter and more specifically to a high-speed voltage-level converter for use in a digital-to-analog converter.

2. Description of the Related Art

A voltage-level converter converts a signal in a voltage level to another signal at another voltage level. In modern integrated circuits (ICs), different components operate in different voltage levels to reduce the overall power consumption without degrading their performance. However, the signal generated by a circuit operating in one voltage level may be incompatible for operation with another circuit operating in another voltage level. Therefore, signals generated by the circuit powered at one voltage level are converted to signals compatible with another circuit operating in a different voltage level by using a voltage-level converter.

Voltage-level converters are used in various components, including high-speed and high-accuracy digital-to-analog converters (DACs). The digital logic of a DAC operates with a supply voltage lower than the supply voltage of the analog output stage. Because the digital logic and the analog output stage operate in different voltage levels, a voltage-level converter is used in a DAC to interface the digital logic of the DAC with the analog output stage.

Due to the ever increasing digital processing power and speed of modern chips, the need for DACs with higher sampling speed is on the rise. For example, 3D high-definition televisions (HDTVs) use DACs with 200 Mega samples per second (MSPS) while telecommunication transmitters use DACs with over 300 MSPS. In addition to the high sampling speed, many of these applications also require very high linearity and high Spurious-Free Dynamic Range (SFDR) in the output analog signal. As the digital logic takes longer time to respond to input signals, jitter is more likely to occur in the analog output because the response delay becomes modulated by external disturbances. Hence, the voltage-level converter should respond promptly to interfacing signals to minimize jitter in the analog output stage.

SUMMARY

Embodiments relate to a voltage-level converter including a switch and a capacitor connected to the switch for converting an input signal changing in one voltage range to a converted signal changing in another voltage range. The switch may receive the input signal and generate an intermediate signal in response to the input signal. The capacitor may have a first conductor connected to the switch to receive the intermediate signal and a second conductor connected to an output of the voltage-level converter. The capacitor generates a converted signal at the second conductor changing in the other voltage range.

In one embodiment, the switch includes a plurality of metal-oxide-semiconductor field-effect transistors (MOSFET) implemented by thin-oxide devices operating at a higher switching speed compared to thick-oxide devices.

In one embodiment, the switch increases a voltage of the intermediate signal responsive to decrease in a voltage of the input signal and decreases the voltage of the intermediate signal responsive to increase in the voltage of the input signal.

In one embodiment, the switch is connected to a voltage source providing a voltage that corresponds to a difference between a highest voltage and a lowest voltage of the other voltage range.

In one embodiment, a refreshing mechanism is connected to the second conductor of the capacitor. The refreshing mechanism refreshes electric charge in the capacitor by coupling the capacitor to a voltage source. The refreshing mechanism may periodically connect the second conductor of the capacitor to the voltage source.

In one embodiment, the refreshing mechanism is configured to connect the second conductor of the capacitor to a voltage source before or after the transitions of the converted signal.

BRIEF DESCRIPTION OF THE DRAWINGS

The teachings of the embodiments can be readily understood by considering the following detailed description in conjunction with the accompanying drawings.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments relate to a voltage-level convertor that uses a capacitor to generate a level-converted signal changing in a voltage range in response to receiving an input signal changing in another voltage range. The voltage-level converter also includes a switch operating in a low voltage level, which can be implemented as a thin oxide device responding quickly to the input signal. The capacitor is coupled between the switch and an output of the voltage-level converter. The switch generates an intermediate signal based on the input signal. The capacitor receives the intermediate signal at one of its conductor, and generates a converted signal at the other conductor. Electrical charge stored in the capacitor can be refreshed before or after the output signal transitions to prevent a refreshing operation from contaminating the converted signal timing, meaning to add jitter.

Figure 1:
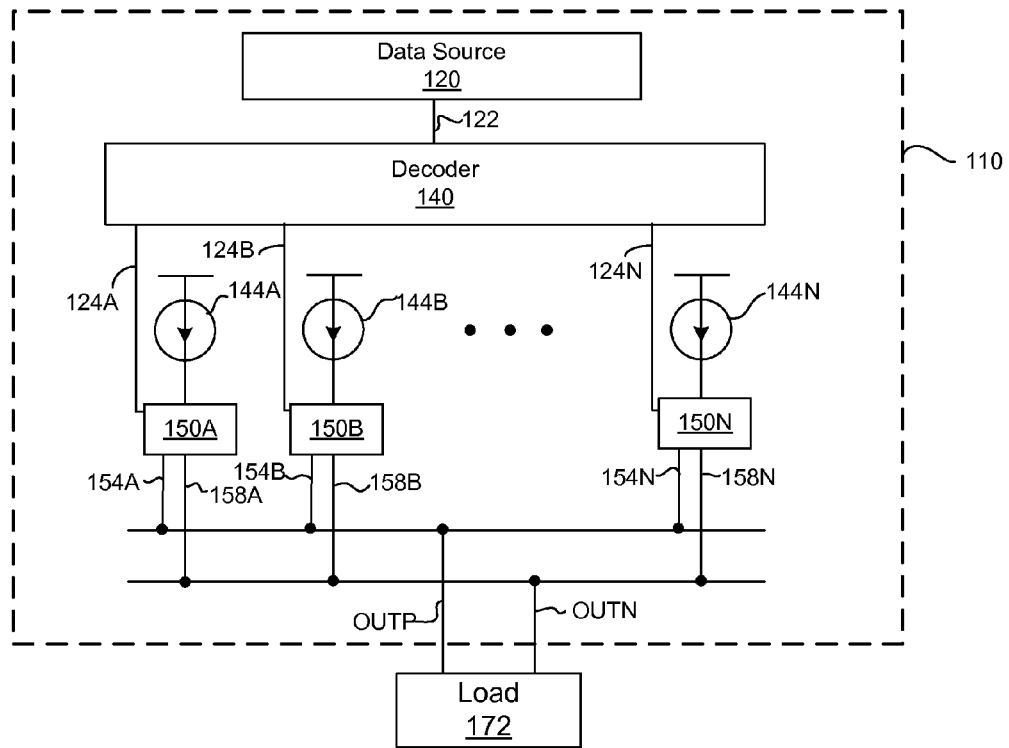
FIG. 1 is a block diagram illustrating a digital-to-analog converter (DAC), according to one embodiment.

FIG. 1 is a block diagram illustrating a DAC 110 according to one embodiment. DAC 110 has differential outputs (OUTP and OUTPN) via which a differential output signal is provided to load 172. The differential output signal is based on, for example, an external signal (not shown) that is processed at data source 120. DAC 110 may include, among other components, data source 120, a decoder 140, a plurality of current sources 144A through 144N (hereinafter collectively referred to as "current sources 144" or individually as "current source 144"), and a plurality of switching modules 150A through 150N (hereinafter collectively referred to as "switching module 150" or individually as "switching module 150"). DAC 110 may include other components not illustrated in FIG. 1 such as a power source and components for reducing electromagnetic interference (EMI).

Data source 120 is hardware, firmware, software or a combination thereof for processing digital signals. Digital source 120 may receive external signals (not shown) and process these signals using digital signal processing (DSP) algorithms to compute a differential voltage level to be output at differential outputs OUTP and OUTN. Digital data 122 may be a binary signal representing the differential voltage level across outputs OUTP and OUTN. In one example, digital data 122 is 8 bit binary signal that can represent 256 distinct values.

Decoder 140 is a binary-to-thermometer decoder circuit that converts binary coded digital data 122 from data source 120 into thermometer coded decoder signals 124A through 124N (hereinafter collectively referred to as "decoder signals 124") using a method well known in the art or to be developed in the future.

Each of current sources 144A through 144N provides current via each of switching modules 150A through 150N to one of two differential outputs OUTP and OUTN. Current sources 144 may be embodied using any conventional current sources or any current sources to be developed in the future.

Each switch module 150A though 150N connects a corresponding current source 144A though 144N to OUTP via line 154A through 154N or to OUTPN via line 158A through 158N in response to receiving decoder signals 124A through 124N. As different current sources 144 are coupled to differential outputs OUTP or OUTN via switch modules 150, the voltage difference across differential outputs OUTP and OUTN provided to load 172 changes accordingly.

Figure 2:
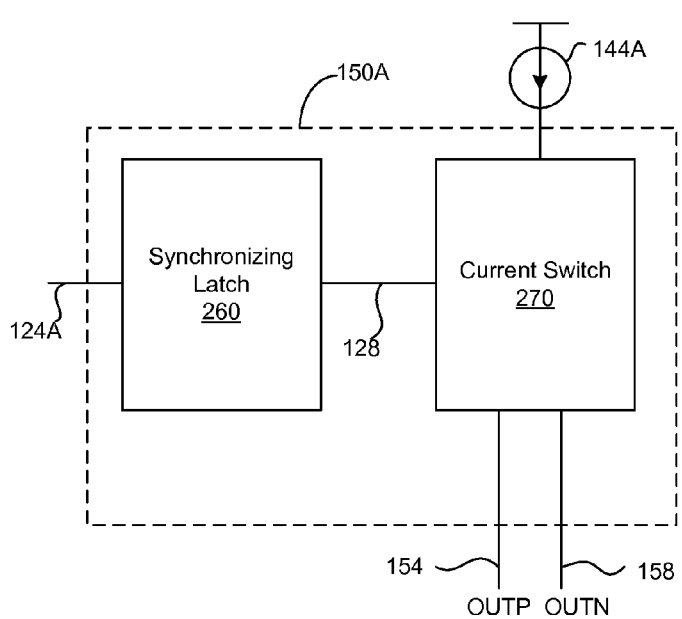
FIG. 2 is a circuit diagram illustrating a switching module in a DAC, according to one embodiment.

FIG. 2 is a circuit diagram illustrating a switching module 150A in DAC 110, according to one embodiment. Switching module 150A receives decoder signal 124 and couples current source 144A to line 154 or line 158. Switching module 150 may include, among other components, a synchronizing latch 260 and a current switch circuit 270. Synchronizing latch 260 may be embodied as a hardware circuit that produces latch output 128 which is a synchronized version of decoder signal 124.

Current switch circuit 270 includes one or more switches that operate based on latch output 128. The one or more switches selectively couple current source 144 to line 154 or 158. Current switch circuit 270 may be embodied using various circuits well known in the art or to be developed in the future, for example, as described below in detail with reference to FIGS. 3A and 3B.

Although FIG. 2 describes switching module 150A, switching modules 150B through 150D also have the same structure and functions as switching module 150A. Hence, detailed description of switching modules 150B through 150D is omitted herein for the sake of brevity.

Figure 3A:
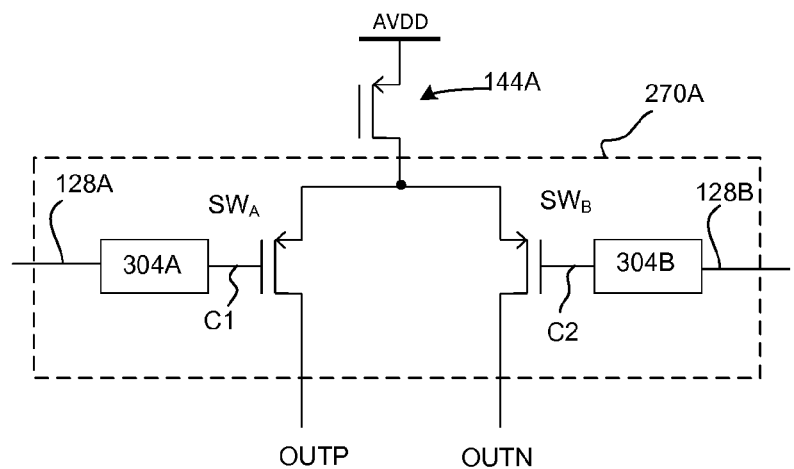
FIG. 3A is a circuit diagram of a current switch circuit connected to a current source, according to one embodiment.

FIG. 3A is a circuit diagram of current switch circuit 270A connected to current source 144A and steering current to output OUTP or OUTN, according to one embodiment. Current switch circuit 270A may include switches $SW_A$ and $SW_B$ and voltage-level converters 304A and 304B. Switch $SW_A$ is connected between current source 144A (embodied as a PFET 144A connected to supply voltage AVDD) and OUTP. Switch $SW_B$ is connected between current source 144A and OUTPN. Each of the switches $SW_A$ and $SW_B$ are turned on or off based on signals C1 and C2 from level converters 304A and 304B, respectively. Latch output 128 includes two signal elements 128A and 128B. In one embodiment, signal element 128A and 128B are represented by a digital signal 128 which has "on" voltage of 1.2V and the "off" voltage of 0V, as described below in detail with reference to FIG. 5. In contrast, switches $SW_A$ and $SW_B$ operate at a gate voltage level higher than signal element 128A and 128B. For example, the operating gate voltage $V_{C1}$ of signal C1 is from 1.3V to 2V, as described below in detail with reference to FIG. 6. These signal elements 128A and 128B are generated by digital logic using a source voltage that is lower than the source voltage associated with switches $SW_A$ and $SW_B$. Hence, voltage-level converters 304A and 304B convert signal element 128A and 128B of latch output 128 to signals C1 and C2 to control switches $SW_A$ and $SW_B$.

Figure 3B:
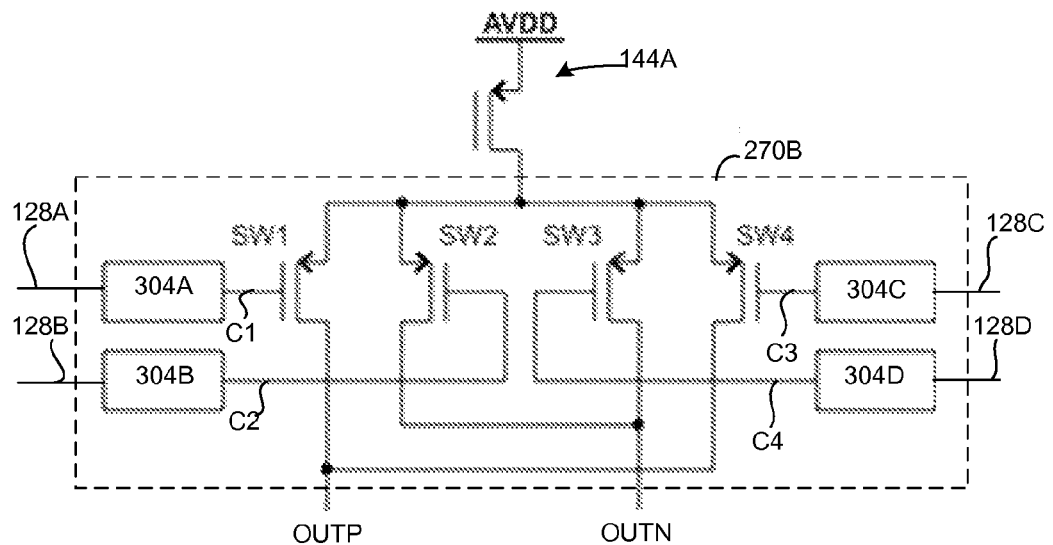
FIG. 3B is a circuit diagram of a current switch circuit operated by a quad switching scheme, according to one embodiment.

FIG. 3B is a circuit diagram of current switch circuit 270B operated by a quad switching scheme, according to one embodiment. Current switch circuit 270B may include switches SW1 through SW4 and voltage-level converters 304A through 304D. Two of the switches SW1 and SW4 are connected between current source 144A (embodied as a PFET 144A connected to supply voltage AVDD) and OUTP. The remaining switches SW2 and SW3 are connected between current source 144A and OUTPN. Each of the switches SW1 through SW4 are turned on or off based on control signals C1 through C4, respectively. In one embodiment, only one of the control signals C1 through C4 is active in a clock cycle, and the active control signals C1 through C4 shift in every clock cycle. After a control signal activates a switch in a cycle, an adjacent switch is activated in a next clock cycle.

Latch output 128 includes four signal elements 128A through 128D. These signal elements 128A through 128D are generated by digital logic using a source voltage that is lower than the source voltage associated with switches SW1 through SW4. In one embodiment, each signal element 128A through 128D is represented by an input digital signal 128 which has "on" voltage of 1.2V and the "off" voltage of 0V, as described below in detail with reference to FIG. 5. In contrast, switches SW1 through SW4 operate at a gate voltage level higher than input digital signal 128. For example, the operating gate voltage $V_{C1}$ of signal C1 is from 1.3V to 2V, as described below in detail with reference to FIG. 6. Due to such different levels of voltage in signal 128 and signal C1, voltage-level converters 304A through 304D are placed between synchronizing latch 260 and switches SW1 through SW4.

Current switch circuits 270A and 270B illustrated in FIG. 3A and 3B are merely illustrative. Embodiments may employ various other types of conventional current switch circuits or current switch circuits to be developed in the future.

Figure 4:
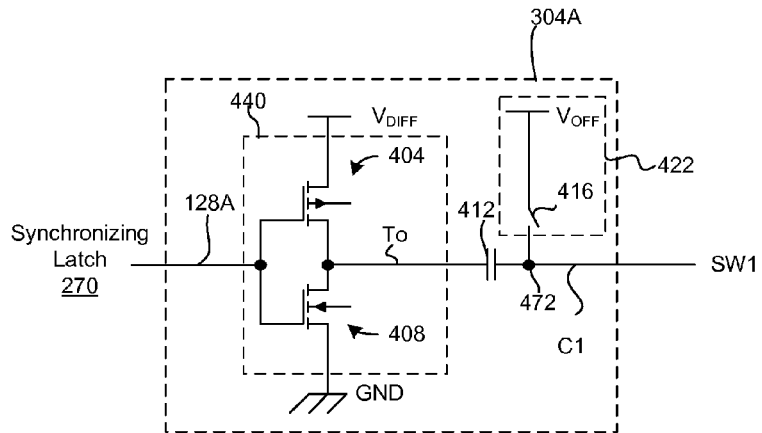
FIG. 4 is a voltage-level converter in the current switch circuit of FIG. 3, according to one embodiment.

FIG. 4 is a voltage-level converter 304A in current switch circuit 270A or current switch circuit 270B, according to one embodiment. Voltage-level converter 304A may include, among other components, a switch 440, a capacitor 412 and a refreshing mechanism 422. Switch 440 is connected between synchronization latch 260 and functions as an inverter that generates signal To in response to signal element 128A. When the voltage of signal element 128A increases, the voltage of switch output signal To decreases. Conversely, when the voltage of signal element 128A decreases, the voltage of signal To increases. In one embodiment, switch 440 includes a p-channel metal-oxide-semiconductor field-effect transistor (pMOSFET) 404 and a n-channel metal-oxide-semiconductor field-effect transistor (nMOSFET) 408 connected in series between a voltage source (providing voltage $V_{DIFF}$) and ground GND.

In one embodiment, a voltage source provides voltage $V_{DIFF}$ to switch 440, which is set as the difference between the highest voltage level ($V_{OFF}$) and the lowest voltage level ($V_{ON}$) of converted signal C1. That is, voltage $V_{DIFF}$ is set according to the following equation:

$$V_{DIFF} = V_{OFF} - V_{ON} \qquad (1)$$

If $V_{DIFF}$ is small, then pMOSFET 404 and nMOSFET 408 can be embodied as thin-oxide devices having a higher switching speed compared to thick-oxide devices. For example, if $V_{OFF}$ is set to 2V and $V_{ON}$ is set to 1.3V, $V_{DIFF}$ is 0.7V. Such voltage level of $V_{DIFF}$ is small enough to allow thin-oxide devices to be used as pMOSFET 404 and nMOSFET 408.

Capacitor 412 is electrically charged by refreshing mechanism 422 to a voltage level $V_{OFF}$ when signal To is high (To=$V_{DIFF}$). Capacitor 412 has two conductors, a first conductor connected to the output of switch 440 and a second conductor connected to the gate of switch SW1. Capacitor 412 maintains a voltage difference across its two conductors. Hence, when voltage To provided to the first conductor of capacitor 412 increases or decreases, the voltage $V_{C1}$ of converted signal C1 increases or decreases accordingly. Capacitor 412 advantageously changes the voltage level of signal To instantaneously in response to the voltage level of signal To with minimal or no lag time.

Figure 5:
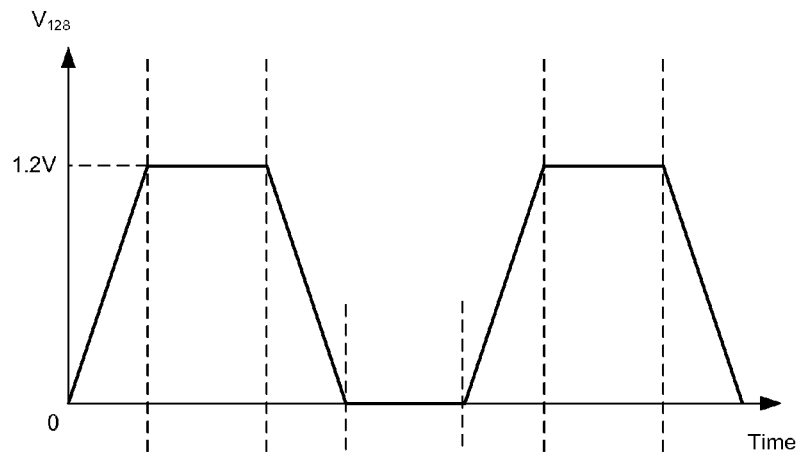
FIG. 5 is a timing diagram illustrating an input signal to a voltage-level converter, according to one embodiment.
Figure 6:
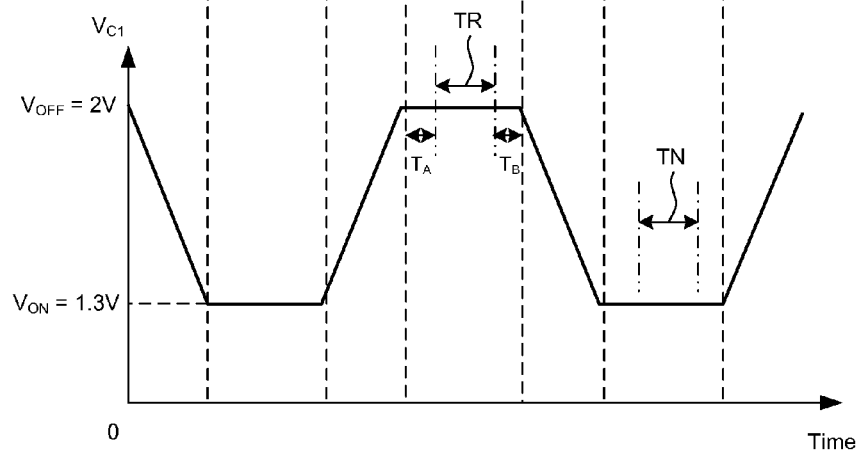
FIG. 6 is a timing diagram illustrating an output signal from the voltage-level converter, according to one embodiment.

FIG. 5 is a timing diagram illustrating the waveform of signal element 128A to voltage-level converter 304A, according to one embodiment. FIG. 6 is a timing diagram illustrating a converted signal C1 generated by voltage-level converter 304A, according to one embodiment. When the voltage $V_{128}$ of signal element 128A turns low (OFF), the voltage level of To decreases to zero (since nMOSFET 408) is coupled to ground GND). As a result, the voltage at the second conductor of capacitor 412 also decreases by $V_{DIFF}$, pulling down voltage $V_{C1}$ of converted signal C1 to $V_{ON}$ (=$V_{OFF}$–$V_{DIFF}$). Conversely, when the voltage $V_{128}$ of signal element 128A turns high (ON), the voltage level of To decreases to $V_{DIFF}$. As a result, the voltage at the second conductor of capacitor 412 also increase by $V_{DIFF}$, pulling up voltage $V_{C1}$ of converted signal C1 to $V_{OFF}$ (=$V_{ON}$+$V_{DIFF}$).

Capacitor 412 may experience drop in stored electric charge with progress of time due to leakage current. Although the conductor of capacitor 412 is connected to the gate of switch SW1 having high impedance, leakage current may eventually drop the voltage difference across the two conductors of capacitor 412. Hence, electric charge in capacitor 412 should be refreshed periodically to maintain the voltage difference across the two conductors of capacitor 412. For this purpose, refresh mechanism 422 is provided in voltage-level converter 304A.

Refresh mechanism 422 may include, among other components, a voltage source providing $V_{OFF}$ voltage and a switch 416 for connecting node 472 to the voltage source $V_{OFF}$. Although it is advantageous to use a thin-oxide device as switch 416 for fast switching speed, $V_{OFF}$ voltage may be too high to use a thin-oxide device as switch 416. That is, the high level of $V_{OFF}$ voltage may require the use of a thick-oxide device. However, thick-oxide devices tend to operate at a slower speed compared to thin-oxide devices. Hence, when a thick-oxide device is used as switch 416, converted signal C1 may become contaminated by external disturbances or jitter.

In order to prevent slow switching of switch 416 from affecting converted signal C1, the refresh operation may be performed at times when converted signal C1 is stable (i.e., when converted signal C1 is not transitioning). For example, refresh mechanism 422 connects a voltage source providing voltage $V_{OFF}$ to node 472 during period TR as illustrated in FIG. 6. TR period starts $T_A$ time after ramp up of converted signal C1 to $V_{OFF}$ and $T_B$ time before starting transition from $V_{OFF}$ to $V_{ON}$ of converted signal C1. Because the refreshing operation is not performed during transitions of converted signal C1, the slow speed of switch 416 causes minimal or no jitter in converted signal C1.

In another embodiment, the voltage source in refreshing mechanism 422 provides voltage $V_{ON}$ rather than $V_{OFF}$. Also, the refreshing operating is performed at time TN (refer to FIG. 6) when the voltage $V_{C1}$ should be $V_{ON}$.

In one embodiment, refresh mechanism 422 receives a refresh clock signal (not shown) to turn on switch 416. The gate of switch 416 receives the refresh clock signal. Switch 416 is periodically turned on or off based on the refresh clock signal.

Although only voltage-level converter 304A is described above with reference to FIGS. 3 through 6, voltage converters 304B through 304D may have the same structure and function as voltage-level converter 304A except that voltage converter 304B through 304D are connected to receive different signal elements 128B through 128D and are connected to different switches SW2 through SW4. Hence, detailed description of voltage converters 304B through 304D is omitted herein for the sake of brevity.

Figure 7:
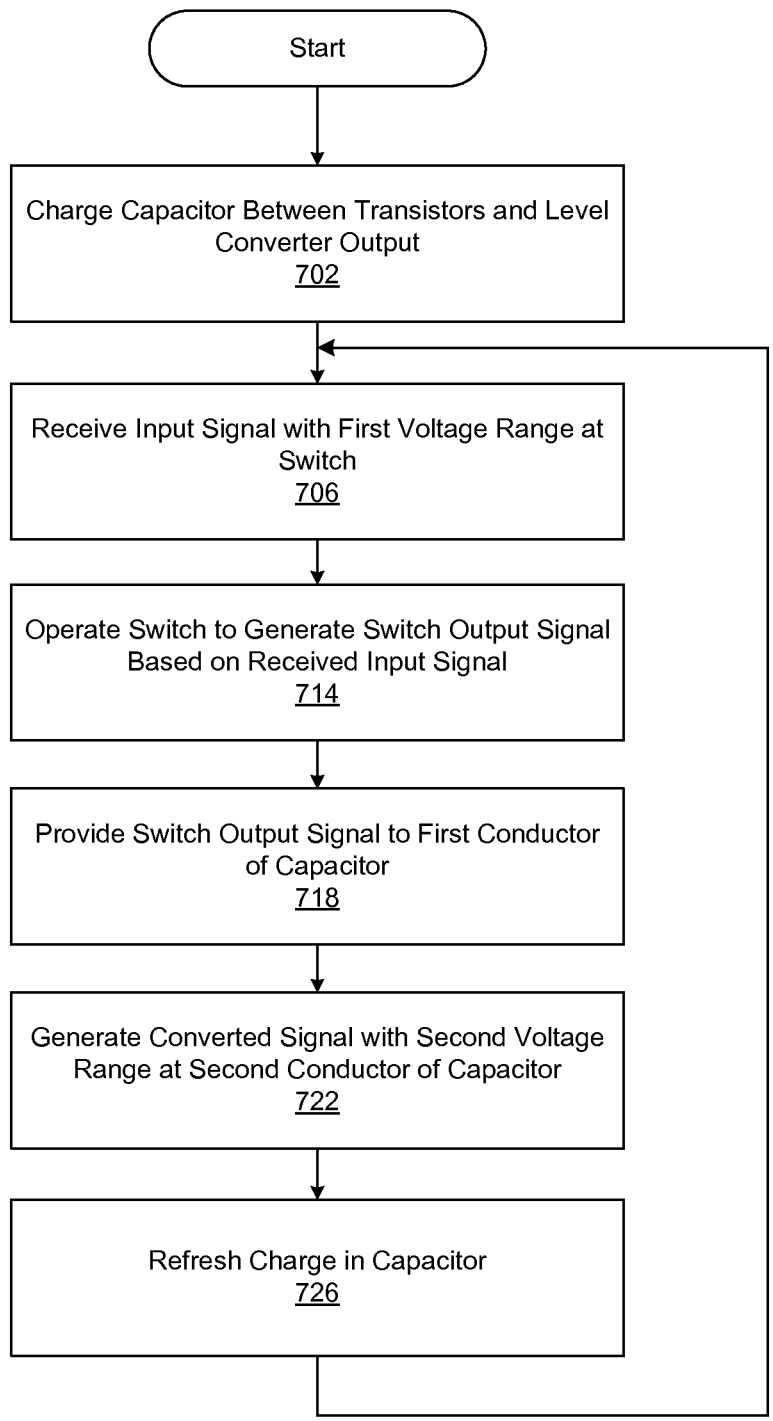
FIG. 7 is a flowchart illustrating a method of performing level-conversion, according to one embodiment.

FIG. 7 is a flowchart illustrating a method of performing level-conversion, according to one embodiment. Capacitor 412 is first charged 702 by refreshing mechanism 422 to store electric charge. As a result, a voltage difference is created between two conductors of capacitor 412. Switch 440 receives 706 signal element 128A from synchronizing latch 260. Signal element 128A operates in a first voltage range (e.g., from 0V to 1.2V).

Switch 440 is operated 714 to generate switch output signal To based on received signal element 128A. Switch output signal To is provided 718 to the first conductor of capacitor 412 connected to switch 440. In response, converted signal C1 is generated 722 at the second conductor of capacitor 412 connected to switch SW1.

If it is time to refresh the charge in capacitor 412, refreshing mechanism 422 is operated to supply voltage $V_{OFF}$ to capacitor 412 to refresh 726 electric charge in capacitor 412.

The process then returns to receiving signal element 128A at switch 440 and repeats the subsequent steps.

Although the voltage-level converter is described herein primarily with reference to DACs, the voltage-level converter can also be used in other applications that need to switch current, such as current mode output drivers.

Upon reading this disclosure, those of ordinary skill in the art will appreciate still additional alternative structural and functional designs through the disclosed principles of the present invention. Thus, while particular embodiments and applications have been illustrated and described, it is to be understood that embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A voltage-level converter in a digital-to-analog converter, comprising:
   a switch turned on or off by an input signal changing in a first voltage range, the switch configured to generate an intermediate signal changing in a second voltage range, the switch comprising a plurality of thin-oxide metal-oxide-semiconductor field-effect transistors (MOSFET) connected in series between a voltage source of a first voltage level and another voltage source of a second voltage level lower than the first voltage level;
   a capacitor having a first conductor connected to the switch to receive the intermediate signal and a second conductor connected to an output of the voltage-level converter, the capacitor configured to store electric charge and generate a converted signal at the second conductor responsive to receiving the intermediate signal, the converted signal changing in a third voltage range having a highest voltage level and a lowest voltage level lower than the highest voltage level by a voltage difference between the first voltage level and the second voltage level; and
   a refreshing transistor coupled to the capacitor and configured to periodically refresh electric charge stored in the capacitor.

2. A voltage-level converter, comprising:
   a switch coupled between a voltage source of a first voltage level and another voltage source of a second voltage level, the switch controlled by an input signal changing in a first voltage range, the switch configured to generate an intermediate signal changing in a second voltage range; and
   a capacitor having a first conductor connected to the switch to receive the intermediate signal and a second conductor connected to an output of the voltage-level converter, the capacitor configured to storing electric charge and generate a converted signal at the second conductor responsive to receiving the intermediate signal, the converted signal changing in a third voltage range between a highest voltage level and a lowest voltage level lower than the highest voltage level by a voltage difference between the first voltage level and the second voltage level.

3. The voltage-level converter of claim 2, wherein the switch comprises a plurality of thin-oxide metal-oxide-semiconductor field-effect transistors (MOSFETs).

4. The voltage-level converter of claim 3, wherein the switch operates as an inverter that increases a voltage level of the intermediate signal responsive to decrease in a voltage level of the input signal and decreases the voltage level of the intermediate signal responsive to increase in the voltage level of the input signal.

5. The voltage-level converter of claim 2, further comprising a refreshing mechanism connected to the second conductor of the capacitor, the refreshing mechanism configured to refresh electric charge in the capacitor.

6. The voltage-level converter of claim 5, wherein the refreshing mechanism periodically connects the second conductor of the capacitor to a voltage source providing a voltage that corresponds to a highest voltage of the third voltage range.

7. The voltage-level converter of claim 5, wherein the refreshing mechanism is configured to connect the second conductor of the capacitor to a voltage source before or after transitions in the converted signal 8. The voltage-level converter of claim 5, wherein the refreshing mechanism comprises at least one thick-oxide metal-oxide-semiconductor field-effect transistor (MOSFET).

9. The voltage-level converter of claim 8, wherein the second conductor of the capacitor is coupled to a gate of a transistor.

10. The voltage-level converter of claim 2, wherein the lowest voltage level of the third voltage level is higher than a highest voltage level of the first voltage level.

11. A method of operating a voltage-level converter, comprising:
    controlling a switch coupled between a voltage source of a first voltage level and another voltage source of a second voltage level by an input signal changing in a first voltage range;
    generating an intermediate signal by the switch, the intermediate signal changing in a second voltage range;
    receiving the intermediate signal by a capacitor having a first conductor connected to the switch; and
    generating a converted signal at a second conductor of the capacitor responsive to receiving the intermediate signal, the converted signal changing in a third voltage range between a highest voltage level and a lowest voltage level lower than the highest voltage level by a voltage difference between the first voltage level and the second voltage level.

12. The method of claim 11, wherein the switch comprises a plurality of thin-oxide metal-oxide-semiconductor field-effect transistors (MOSFETs).

13. The method of claim 12, wherein generating the intermediate signal comprises:
    increasing a voltage level of the intermediate signal responsive to decrease in a voltage level of the input signal; and
    decreasing the voltage level of the intermediate signal responsive to increase in the voltage level of the input signal.

14. The method of claim 11, further comprising refreshing electric charge stored in the capacitor.

15. The method of claim 14, further comprising periodically connecting the second conductor of the capacitor to a voltage source of a voltage level that corresponds to the highest voltage level of the third voltage range.

16. The method of claim 15, wherein the second conductor of the capacitor is connected to the voltage source before or after transitions in the converted signal.

17. The method of claim 15, wherein refreshing the electric charge comprises controlling at least one thick-oxide metal-oxide-semiconductor field-effect transistor (MOSFET).

18. The method of claim 11, further comprising sending the converted signal to a gate of a transistor.

19. The method of claim 11, wherein the lowest voltage level of the third voltage level is higher than a highest voltage level of the first voltage level.

20. A digital-to-analog converter comprising:
    a decoder configured to generate a decoder output representing coupling of a combination of current sources to an output of the digital-to-analog converter by a plurality of steering switches;
    a switch coupled between a voltage source of a first voltage level and another voltage source of a second voltage level and configured to receive an input signal changing in a first voltage range from the decoder, the input signal generated based on the decoder output, the switch configured to generate an intermediate signal changing in a second voltage range; and a capacitor having a first conductor connected to the converter switch to receive the intermediate signal and a second conductor connected to an output, the capacitor configured to store electric charge and generate a converted signal at the second conductor to control one of the plurality of steering switches responsive to receiving the intermediate signal, the converted signal changing in a third voltage range between a highest voltage level and a lowest voltage level lower than the highest voltage level by a voltage difference between the first voltage level and the second voltage level.

* * * * *